(12) United States Patent
Barrett et al.

(10) Patent No.: US 6,531,895 B1
(45) Date of Patent: Mar. 11, 2003

(54) ISOLATED GATE DRIVE CIRCUIT HAVING A SWITCHED INPUT CAPACITOR

(75) Inventors: Alfred H. Barrett, Carmel, IN (US); Richard F. Rouser, Logansport, IN (US); Joel F. Downey, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/068,454

(22) Filed: Feb. 8, 2002

(51) Int. Cl.[7] .......................................... H03K 19/0175
(52) U.S. Cl. .......................... 326/82; 327/108; 327/390
(58) Field of Search .................................. 327/390, 380, 327/379, 108; 326/26, 82, 83, 88, 63

(56) References Cited

U.S. PATENT DOCUMENTS 5,055,721 A * 10/1991 Majumdar et al. .......... 327/434
5,910,746 A * 6/1999 Fordyce ...................... 327/379
6,246,296 B1 * 6/2001 Smith ......................... 332/109
6,459,324 B1 * 10/2002 Neacsu et al. .............. 327/379

* cited by examiner

*Primary Examiner*—Don Le
(74) *Attorney, Agent, or Firm*—Jimmy L. Funke

(57) ABSTRACT

An improved gate drive circuit powered by a DC source voltage, the drive circuit having an isolated output stage with a parallel-connected by-pass capacitor and a switched input capacitor circuit that maintains a charge on the by-pass capacitor for driving the gate of a controlled MOS transistor while isolating the by-pass capacitor from the source voltage. In a fully isolated embodiment of the improved gate drive circuit, a bank of controlled switches alternately couples the input capacitor to the source voltage and the by-pass capacitor, while in another embodiment, unidirectional isolation is achieved by replacing one or more of the controlled switches with diodes.

5 Claims, 2 Drawing Sheets

ISOLATED GATE DRIVE CIRCUIT HAVING A SWITCHED INPUT CAPACITOR

TECHNICAL FIELD

This invention relates to a gate drive circuit for a MOS power transistor, and more particularly to a low cost gate drive circuit having an isolated output stage.

BACKGROUND OF THE INVENTION

Various circuits, including many power supply and motor control circuits, utilize one or more MOS transistor switches (MOSFETs or IGBTs) to selectively couple a load to a power supply. In general, one terminal of the power supply is designated as the circuit common or ground, and transistors that couple the load to the circuit ground are referred to as low-side switches, whereas transistors that couple the load to the other terminal of the power supply are referred to as high-side switches. Since the emitter or source of a low-side transistor is referenced to circuit ground, its gate drive circuit may also be referenced to ground, and a simple and inexpensive circuit design may be used. However, the emitter or source of a high-side transistor floats with respect to ground, and its gate drive circuit must therefore be isolated from ground. Drive circuit isolation may be accomplished in several different ways, but all are expensive, and the gate drive circuit frequently costs more than the power transistor it controls. Accordingly, what is needed is a simple and inexpensive isolated gate drive circuit.

SUMMARY OF THE INVENTION

The present invention is directed to an improved low-cost gate drive circuit powered by a DC source voltage, the drive circuit having an isolated output stage with a parallel-connected by-pass capacitor and a switched input capacitor circuit that maintains a charge on the by-pass capacitor for driving the gate of a controlled MOS transistor while isolating the by-pass capacitor from the source voltage. In a fully isolated embodiment of the improved gate drive circuit, a bank of controlled switches alternately couples the input capacitor to the source voltage and the by-pass capacitor, while in another embodiment, unidirectional isolation is achieved by replacing one or more of the controlled switches with diodes.

DESCRIPTION OF THE PREFERRED EMBODIMENT

Figure 1:
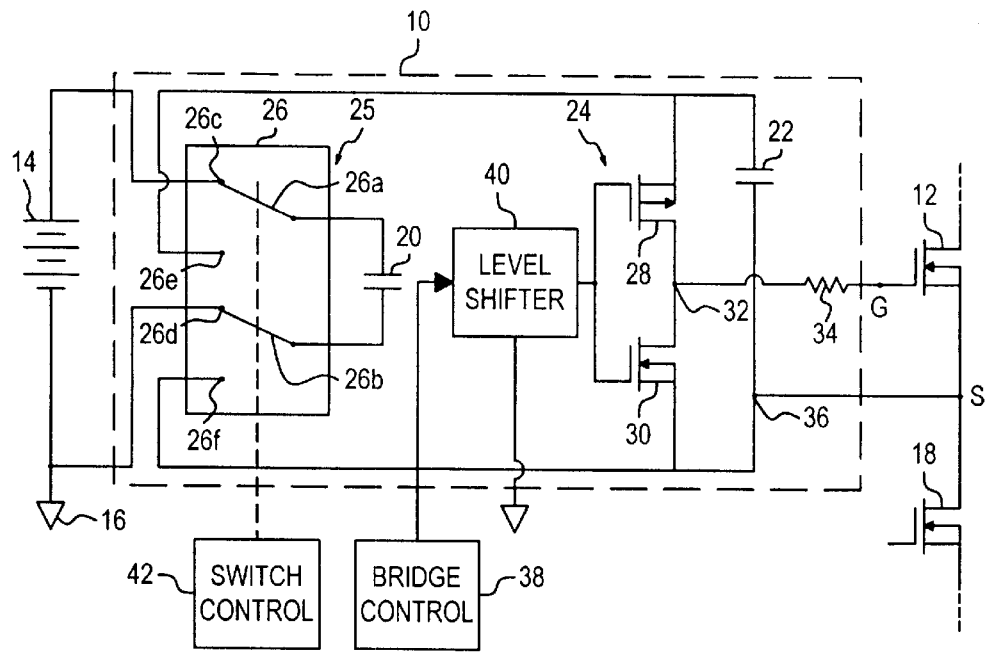
FIG. 1 is a simplified circuit diagram of a fully isolated gate drive circuit according to this invention.

Referring to FIG. 1, the reference numeral 10 generally designates a gate drive circuit coupled across the gate (G) and source (S) terminals of a power MOSFET 12 (or alternately, an IGBT). The gate drive circuit 10 is powered by a DC source such as battery 14, the negative terminal of which is designated as circuit common or ground, as indicated by the reference numeral 16. The circuit application of MOSFET 12 is not important to the present invention, but it may be assumed for purposes of this disclosure that MOSFET 12 is configured as a high-side switch in a bridge circuit including a low-side MOSFET 18 that is referenced to the circuit ground or another voltage.

Thus, the voltage potential at source (S) is not fixed, but instead varies depending on the conduction states of the MOSFETs 12 and 18.

The gate drive circuit 10 includes an input capacitor 20, a by-pass capacitor 22, an output stage 24, and a capacitor switching arrangement 25 that is illustrated in FIG. 1 as a double-pole double-throw (DPDT) switch 26. The output stage 24, which includes a pair of complementary transistors 28, 30, is coupled across the by-pass capacitor 22, with the node 32 between transistors 28 and 30 coupled to the gate (G) of MOSFET 12 via gate resistor 34 (which may be omitted, depending on the application). In the illustrated embodiment, MOSFET 12 is an N-channel device, and its source (S) is coupled to the node 36 of by-pass capacitor 22; the source (S) of a P-channel device would be coupled to the opposite side of by-pass capacitor 22. The transistors 28 and 30 are controlled by a bridge control circuit, through the agency of a level shifting circuit 40 referenced to circuit ground 16. When transistor 28 is conductive, by-pass capacitor 22 is coupled across the gate (G) and source (S) terminals to bias MOSFET 12 conductive. When transistor 30 is conductive, it creates a low impedance path between the gate (G) and source (S) terminals to bias MOSFET 12 non-conductive. The input capacitor 20 is connected across the switch arms 26a, 26b, the terminals of battery 14 are connected across switch terminals 26c, 26d, and the by-pass capacitor 22 is connected across switch terminals 26e, 26f. The switch arms 26a, 26b are ganged, as indicated, under the control of an external switch control circuit 42.

With the switch arms 26a, 26b positioned as depicted in FIG. 1, input capacitor 20 is connected across battery 14, while being electrically isolated from by-pass capacitor 22; in this state, the input capacitor 20 is charged substantially to the battery terminal voltage. When the switch arms 26a, 26b are oppositely positioned, the input capacitor 20 is coupled in parallel with by-pass capacitor 22, while being electrically isolated from battery 14; in this state, the charge of input capacitor 20 is transferred to by-pass capacitor 22. In operation, the state of switch 26 is periodically reversed by switch control circuit 42 to transfer charge from battery 14 to by-pass capacitor 22 via input capacitor 20, while the output stage transistors 28, 30 are controlled by bridge control circuit 38 to bias MOSFET 12 on and off. Thus, the bridge control circuit 38 and the switch control circuit 42 may operate asynchronously.

Figure 2:
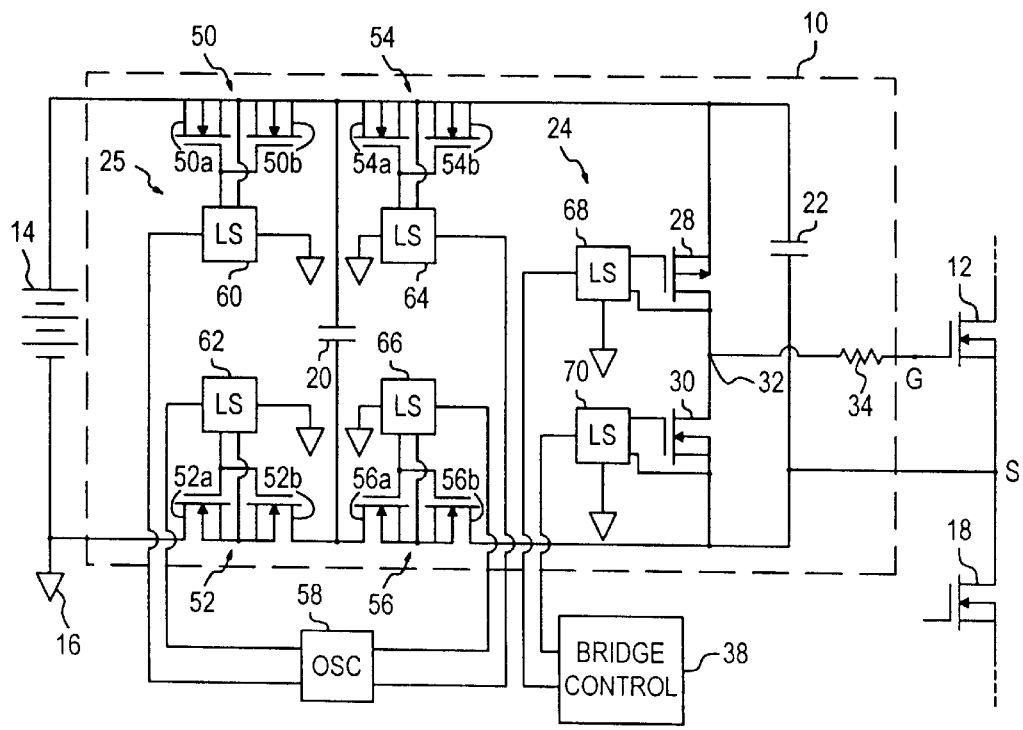
FIG. 2 is a more detailed circuit diagram of the fully isolated gate drive circuit of FIG. 1.

As indicated above, the DPDT switch 26 merely illustrates the functionality of the capacitor switching arrangement 25; in practice, the switching arrangement 25 is implemented with semiconductor switches, one such implementation being shown in FIG. 2. Referring to FIG. 2, the capacitor switching arrangement 25 comprises a set of four semiconductor switches 50, 52, 54, 56, each consisting of a pair of MOS switching transistors 50a, 50b; 52a, 52b; 54a, 54b; 56a, 56b controlled by oscillator (OSC) 58 through the agency of respective level shifting (LS) circuits 60, 62, 64, 66. The switches 50 and 52 couple the input capacitor 20 to the terminals of battery 14, while the switches 54 and 56 couple the input capacitor 20 to by-pass capacitor 22. Oscillator 58 performs the function of switch control circuit 42 by biasing switches 50, 52 and 54, 56 alternately conductive and nonconductive. Thus, the state of switch 26 illustrated in FIG. 1 corresponds to an oscillator state in which switches 50 and 52 are conductive, and switches 54 and 56 are non-conductive, and vice versa for the opposite state of switch 26. In FIG. 2, the output stage transistors 28 and 30 are depicted as having individual level shifting circuits 68, 70, and as in FIG. 1, each of the level shifting circuits 60, 62, 64, 66, 68, 70 are referenced to circuit ground 16.

Figure 3:
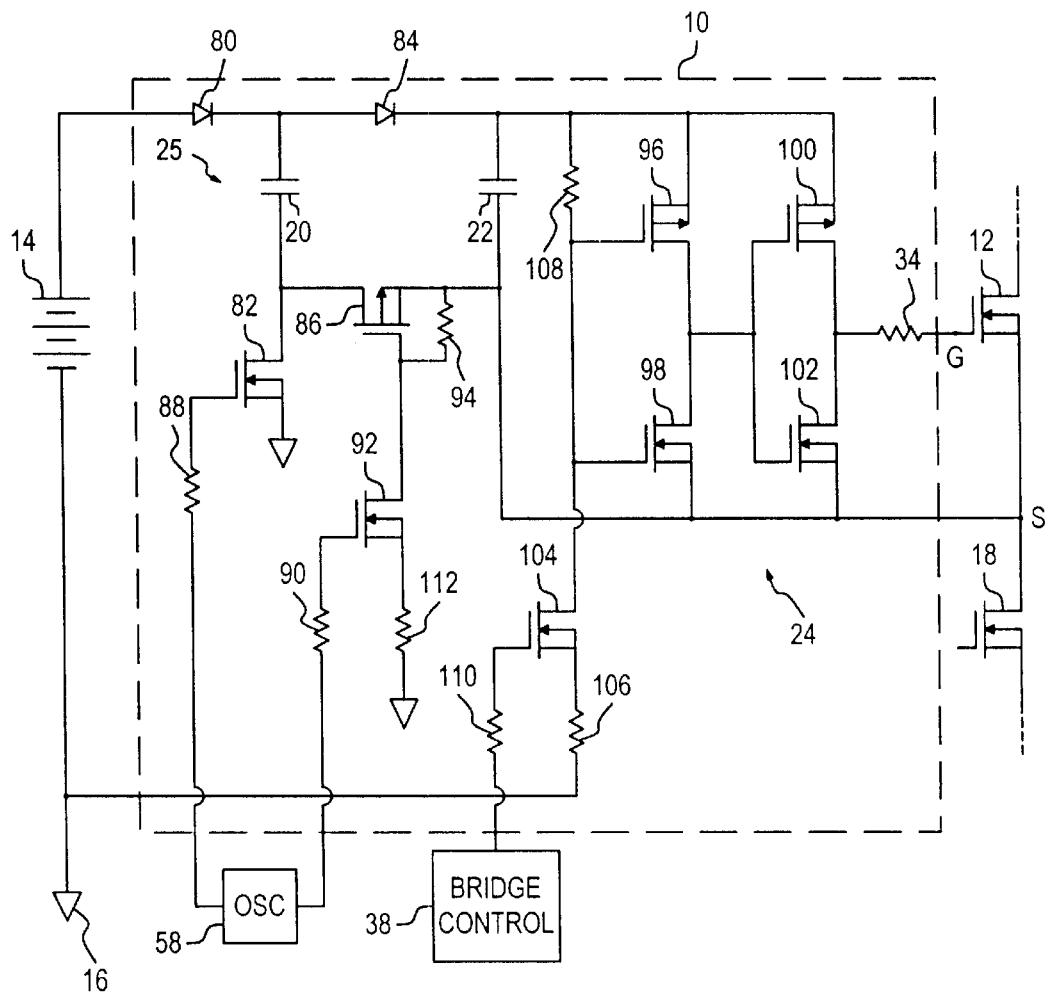
FIG. 3 is a circuit diagram of a uni-directionally isolated gate drive circuit according to this invention.

FIG. 3 depicts another embodiment of the gate drive circuit 10 that uni-directionally isolates the source (S) and gate (G) of MOSFET 12 from battery 14. This arrangement is suitable for applications where the drain (D) of MOSFET 12 is maintained at any potential up to the breakdown voltage of MOSFET 12, including voltages well in excess of battery 14, and simplifies the capacitor switching arrangement 25. Specifically, the switches 50 and 54 of FIG. 2 are replaced with diodes 80 and 84, respectively. The FET 82 carries out the function of switch 52, and MOSFET 86 carries out the function of switch 56. The oscillator 58 drives FET 82 via resistor 88, and drives MOSFET 86 via resistor 90 and a level shifting circuit comprising FET 92, pull-up resistor 94 and resistor 112. In operation, the battery 14 charges input capacitor 20 via diode 80 when FET 82 is biased conductive, and input capacitor 20 transfers its charge to by-pass capacitor 22 via diode 84 when MOSFET 86 is biased conductive. The output stage 24 is illustrated as comprising a first stage complementary transistor pair 96, 98 and a second stage complementary transistor pair 100, 102, both stages being connected in parallel with by-pass capacitor 22. A level shifting circuit comprising the FET 104 and resistors 106, 108 is coupled to the first stage transistors 96, 98, and is controlled by bridge control circuit 38 via resistor 110. In operation, the bridge control circuit 38 biases MOSFET 12 to a conductive state by biasing FET 104 off, thereby rendering output stage transistors 98 and 100 conductive to connect by-pass capacitor 22 across the gate (G) to source (S) circuit of MOSFET 12. The MOSFET 12 is biased to a non-conductive state by biasing FET 104 on, which renders transistors 96 and 102 conductive.

A particularly advantageous aspect of the gate drive circuit 10 lies in its performance advantages, compared to other isolated gate driver topologies. For example, the operating frequency and duty cycle of the output stage 24 may be very high (or very low) and are essentially independent of the capacitor switching arrangement 25. Further, the charge transfer from input capacitor 20 to by-pass capacitor 22 occurs with high efficiency, typically in excess of 90%.

Another advantageous aspect of the gate drive circuit 10 is that it is easily constructed as a single integrated circuit, with the exception of capacitors 20 and 22, which are implemented as external devices. The overall cost of a gate driver so constructed would be relatively low compared with other isolated gate driver topologies, and the circuit would exhibit the performance advantages described in the preceding paragraph.

In summary, this invention provides a low-cost gate drive circuit having an isolated output stage with a parallel-connected by-pass capacitor and a switched input capacitor circuit that maintains a charge on the by-pass capacitor for driving the gate of a controlled device while uni-directionally or bi-directionally isolating the by-pass capacitor from the source voltage. While illustrated in reference to the illustrated embodiments, it is expected that various modifications will occur to persons skilled in the art, as indicated above. Accordingly, it should be understood that gate drive circuits incorporating such modifications may fall within the scope of this invention, which is defined by the appended claims.

What is claimed is:

1. A gate drive circuit for a MOS power transistor comprising:

an output circuit including an output capacitor and an output switch controlled to selectively couple said output capacitor to a gate terminal of said MOS power transistor for controlling a conduction state of said MOS power transistor;

an input circuit including an input capacitor and a voltage source; and a set of switching elements controlled to alternately connect said input capacitor to said voltage source, and to said output capacitor so that said output capacitor is charged from said voltage source via said input capacitor while maintaining isolation between said voltage source and said output circuit.

2. The gate drive circuit of claim 1, wherein said set of switching elements comprises:

a first set of transistor switches effective when activated to connect said input capacitor to said voltage source; and a second set of transistor switches effective when activated to connect said input capacitor to said output capacitor.

3. The gate drive circuit of claim 2, including an oscillator for alternately activating said first and second sets of transistor switches.

4. The gate drive circuit of claim 1, wherein said set of switching elements includes:

a switching transistor and diode effective when said switching transistor is activated to connect said input capacitor to said voltage source.

5. The gate drive circuit of claim 1, wherein said set of switching elements includes:

a switching transistor and diode effective when said switching transistor is activated to connect said input capacitor to said output capacitor.

* * * * *